United States Patent [19]

Kriegel

[11] Patent Number: 5,076,566
[45] Date of Patent: * Dec. 31, 1991

[54] SELF-CALIBRATING SYSTEM FOR DETECTING MEDIA MOVEMENT BY USING CAPACITORS AS SENSORS

[75] Inventor: Jon Kriegel, Rochester, N.Y.

[73] Assignee: Eastman Kodak Company, Rochester, N.Y.

[*] Notice: The portion of the term of this patent subsequent to Jul. 30, 2008 has been disclaimed.

[21] Appl. No.: 553,050

[22] Filed: Jul. 16, 1990

[51] Int. Cl.$^5$ .................... B65H 7/02; G08B 13/26; G08B 21/00
[52] U.S. Cl. .................... 271/265; 271/227; 271/259; 340/563; 340/675
[58] Field of Search ............... 271/227, 258, 259, 265; 340/563, 674, 675

[56] References Cited

U.S. PATENT DOCUMENTS

| | | | |
|---|---|---|---|
| 2,673,340 | 3/1954 | Johansson et al. | 340/563 |
| 3,230,519 | 1/1966 | Metz et al. | 340/563 |
| 3,519,922 | 7/1970 | Nash et al. | 340/675 |
| 3,646,372 | 2/1972 | Snellman et al. | 340/675 |
| 4,258,326 | 3/1981 | Johne | 271/258 |
| 4,276,547 | 6/1981 | Bowen et al. | 340/675 |
| 5,035,415 | 7/1991 | Lee et al. | 271/265 |

FOREIGN PATENT DOCUMENTS

| | | | |
|---|---|---|---|
| 149053 | 6/1981 | German Democratic Rep. | 271/265 |
| 00257 | 5/1979 | PCT Int'l Appl. | 340/563 |
| 720447 | 3/1980 | U.S.S.R. | 340/563 |

Primary Examiner—Robert P. Olszewski
Assistant Examiner—Steven M. Reiss
Attorney, Agent, or Firm—John D. Husser

[57] ABSTRACT

A sheet movement detection system for apparatus having a sheet feed path includes a first capacitor sensor including a first pair of parallel plate members located in opposing relation on opposite sides of the feed path plane at an upstream position and second capacitor sensor including a second pair of parallel plate members, which are correspondingly sized and spaced to said first plate members, in opposing relation on opposite sides of the feed path plane at a downstream position. The sensors are coupled in a detection circuit which applies potentials across the pairs of plate members so that output signals of the first and second sensing means are subtracted from one another. A position circuit detects the output of the detection circuit during movement of a sheet lead edge through the second sensor and provides a sheet lead-edge position signals indicating the position or velocity of the sheet lead edge.

7 Claims, 4 Drawing Sheets

SELF-CALIBRATING SYSTEM FOR DETECTING MEDIA MOVEMENT BY USING CAPACITORS AS SENSORS

FIELD OF THE INVENTION

The present invention relates to systems for detecting the movement (position and/or velocity) of media along a use path and, more particularly, to a system employing capacitive sensors to provide signals that are accurately indicative of the movement of media lead edges vis a vis a feed path.

BACKGROUND OF the INVENTION

A wide variety of detection systems have been employed to sense conditions of sheet feed along a use path, e.g. the feed path of original or copy sheets in copier apparatus, the feed path of documents to be scanned by input scanner devices or the feed path of print sheets within printing machines. Such systems have been used to detect (i) sheet position error (e.g. longitudinal, lateral or skew error), (ii) double sheet feed and (iii) improper sheet type (e.g. transparency versus opaque sheet).

U.S. Pat. Nos. 3,230,519; 3,591,922; 3,646,372 and 4,258,326 disclose the use of capacitive sensing devices to detect the presence or absence of dielectric objects, a variation in thickness because of a web splice and the existence of a double sheet feed. Those systems are not used for accurate movement detection.

In many printing, copying and scanning applications, it is important that movement of fed sheets be very accurate. For example, in situations where image portions of different colors are to be placed on print or copy sheets during successive passes, accurate sheet movement positioning is necessary to assure proper register of the different color image portions. When data is to be printed in proper register on a preprinted form or when personalized printing is to be added to advertising literature, accurate movement of the blank form or advertising signature sheet is important. In systems where input scanners merge data from separate input documents, accurate relative location information can require accurate movement of the input and output sheets.

Commonly assigned U.S. Pat. No. 5,035,415, of July 30, 1991, entitled "System for Detecting the Accurate Positioning of Sheets Along a Feed Path", filed in the names of Lee, Kriegel and Stephany describes a system employing a pair (s) of capacitive sensors disposed in a bridge circuit in a manner which allows precise position detection of a fed sheet vis a vis the feed path.

SUMMARY OF THE INVENTION

One important purpose of the present invention is to provide improved sheet detection systems, which employ capacitive sensors such as described in the above cited application, for detecting movement of a lead sheet edge along the sheet feed path. The system of the present invention is advantageous from the viewpoint of compactness. Moreover, it affords sheet by sheet detection signal calibration so as to avoid errors incident to dielectric variations between individual sheets. A further advantage of the present invention is its versatility in operating with different sheet lengths without locational adjustment of sensors.

In one aspect the present invention constitutes an improved movement detection system for apparatus having a sheet feed path along which sheets are moved to a use location(s). The system comprises first capacitor sensing means including a first pair of parallel plate members located in opposing relation on opposite sides of the feed path plane at an upstream position; and second capacitor sensing means including a second pair of parallel plate members, which are correspondingly sized and spaced to said first plate members, in opposing relation on opposite sides of the feed path plane at a downstream position such that a fed sheet can sequentially pass between the first and second pairs of plate members. The sensing means are coupled in detection circuit means for applying potentials accross the pairs of plate members in a circuit configuration such that output signals of the first and second sensing means are substracted from one another. Position circuit means detects the output of the detection circuit means during movement of a sheet lead edge through the second capacitor sensing means and provides a sheet lead-edge position signals indicating the position of the sheet lead edge.

BRIEF DESCRIPTION OF THE DRAWINGS

The subsequent description of preferred embodiments refers to the accompanying drawings wherein.

DETAILED DESCRIPTION OF THE PREFERRED EMBODIMENTS

Figure 1:
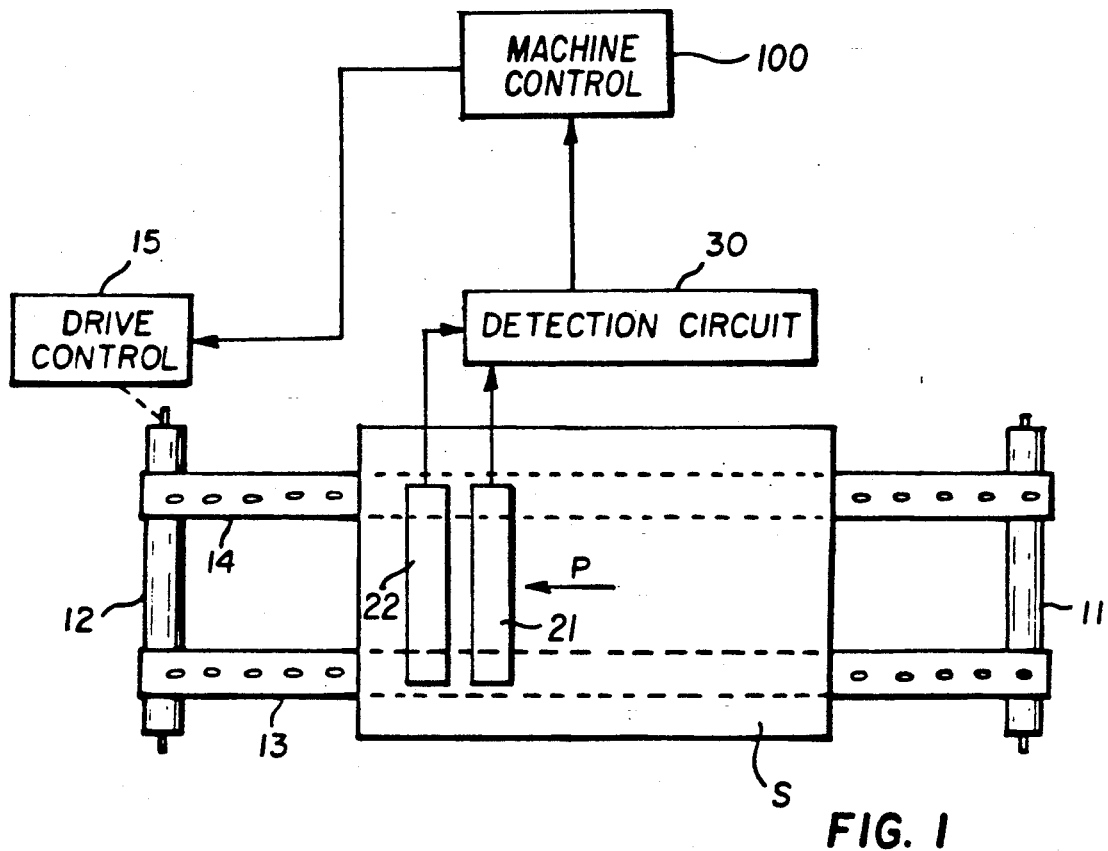
FIG. 1 is a top view of sheet feed apparatus employing one preferred embodiment of sheet-movement detection system in accord with the present invention.
Figure 2:
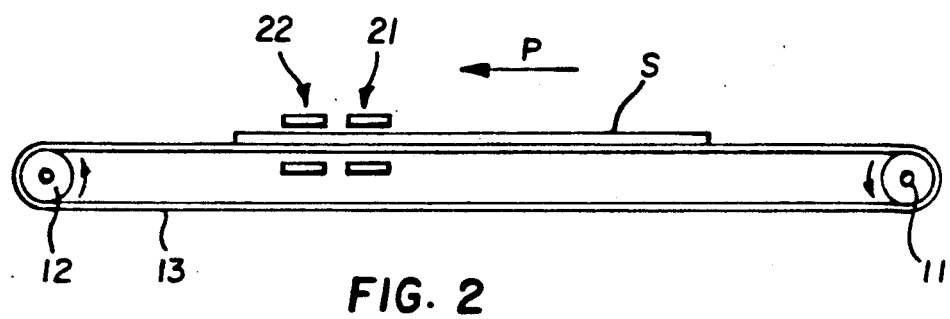
FIG. 2 is a side view of the FIG. 1 system.

FIGS. 1 and 2 illustrate one embodiment of the present invention constructed to operate with a sheet feed device 10, which can be a subsystem of a copier, printer, scanner or similar apparatus. The sheet feed device 10 comprises a pair of rollers 11, 12 by which vacuum belts 13, 14 are driven to transport a sheet S along a feed path P, from right to left as viewed in FIGS. 1 and 2. For example, roller 12 can be driven by a drive control system 15, such as a stepper motor and associated machine control circuitry 100.

Figure 4:
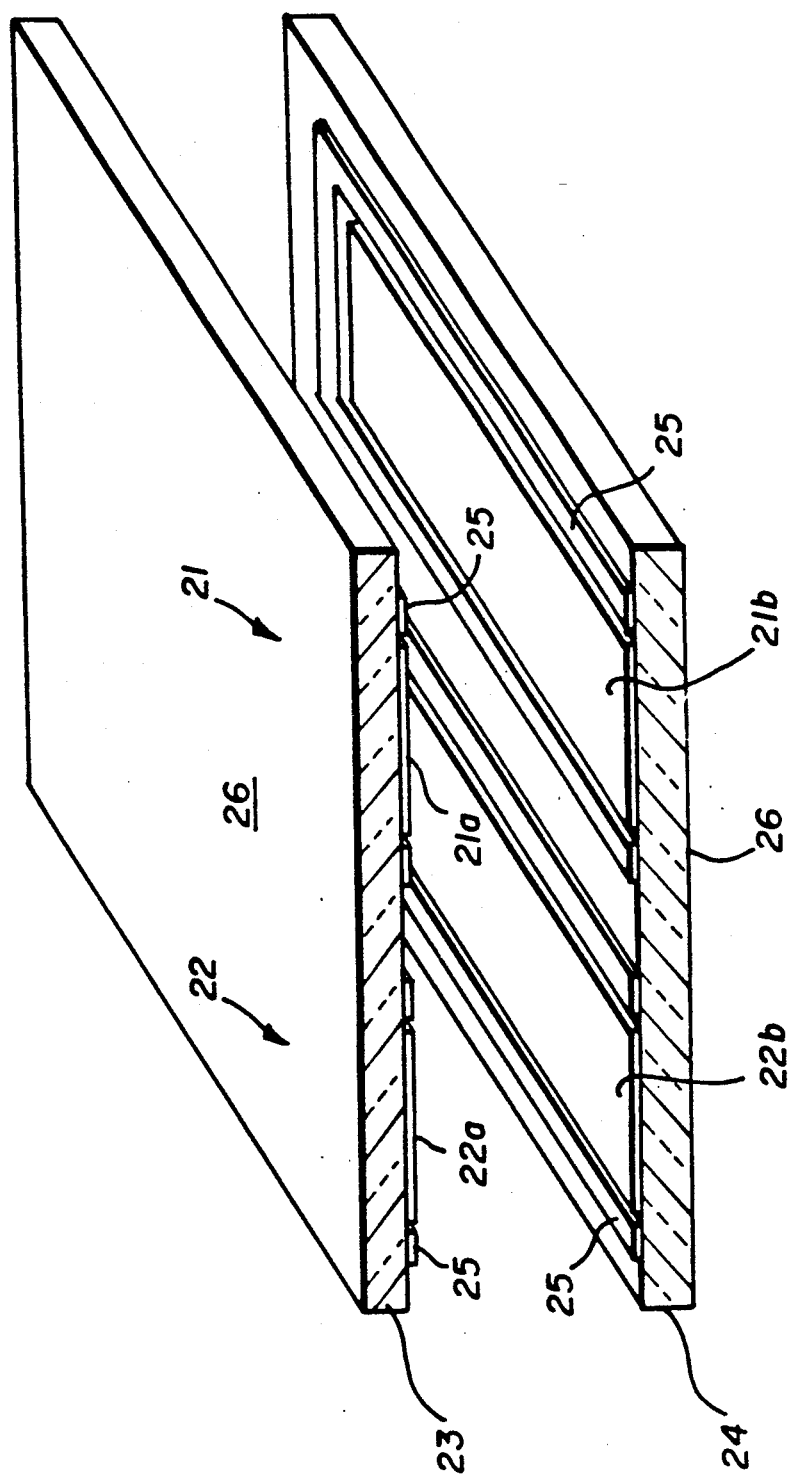
FIG. 4 is an enlarged perspective view of one preferred sensor plate construction in accord with the present invention.

The position detection system of the FIGS. 1 and 2 embodiment comprises first and second sensing means 21, 22; and as more clearly seen in FIG. 4, each of these sensing means comprises a pair of equally sized capacitor plates spaced in parallel, opposing relation on opposite sides of the feed path &. In FIG. 4 plates comprising respective sensing means are denoted with sub-characters "a" and "b", e.g. plates 21a and 21b comprise sensing means 21. In the preferred construction for the sensing means shown in FIG. 4, the plates are formed of phosphor-bronze alloy, have major dimensions of about 1"×7", and are spaced about 0.80 inches. Desirably the plates 21a and 22a are photofabricated on common dielectric substrates 23, and plates 21b and 22b are fabricated in the same way on dielectric substrate 24. To eliminate field fringing the sensing means preferably have a photofabricated boundary electrode portions 25 surrounding each sensing plate portion and portions 25 are coupled to a source of AC potential that is synchronized in phase angle and magnitude to the potential applied to portions 21a, 21b, 22a, 22b. As shown, the portions 25 are not connected to the sensing plate portions. Also grounded backing electrode surface coatings 26 can be provided to effect noise immunity to and from the sensing plates and effect enhanced field contact.

In general, the capacitive sensing means should be sized and spaced so that, when a potential is applied across the spaced plates, the capacitance of the unit varies in direct proportion to the amount of sheet material therebetween. Specifically, the capacitance of each sensor means will increase as sheet material moves increasingly into the gap between the plates.

Figure 3:
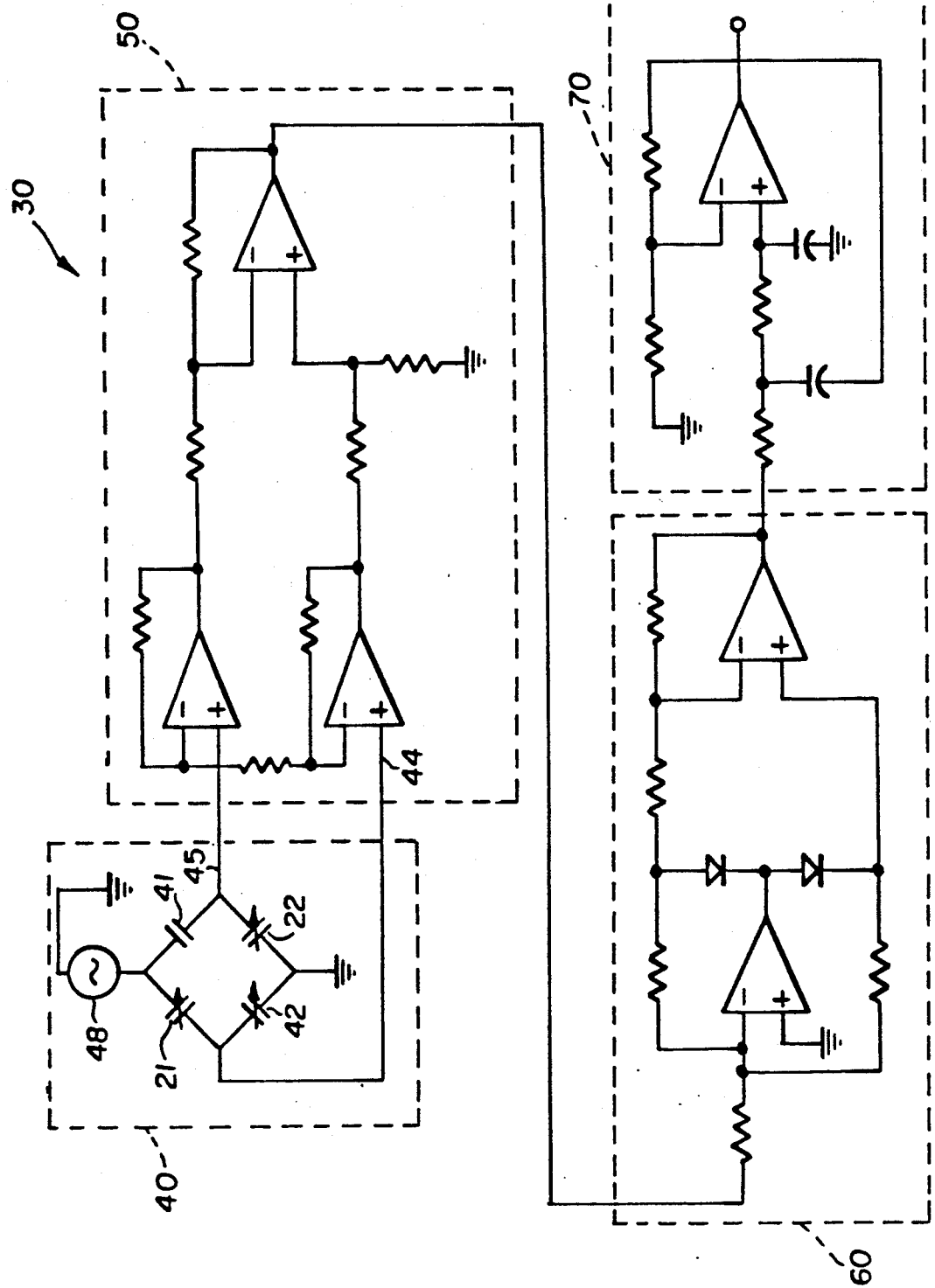
FIG. 3 is a schematic circuit diagram of one embodiment of a detection circuit useful in accord with the present invention.

One preferred mode for the first and second sensing means 21, 22 to function can be understood by reference to FIG. 3, which shows schematic details of a preferred detection circuit 30. The detection circuit 30 comprises a bridge circuit 40, a differential amplifier circuit 50 and, preferably, a rectifier 60 and filter circuit 70. As shown in FIG. 3, the circuit 41 comprises a potential source 48 and is constructed to apply potential to sensors 21, 22 in a capacitive bridge, which also incorporates capacitor 41 and balance adjust capacitor 42 as shown. The output lines 44, 45 from the bridge circuit are applied to the inputs of differential amplifier 50.

The bridge circuit configuration allows the outputs of sensors 21, 22 to be substracted from one another by differential amplifier 50, whose output is amplified, rectified by circuit 60 and filtered by circuit 70 to produce a detection voltage signal Vo. In the FIGS. 1 and 2 embodiment, the signal Vo goes from zero to a positive maximum voltage level Vmax as the sheet lead edge progresses into the first sensing means, completely covering the first sensing means area, and then back to zero then as the lead end of the sheet progresses to gradually cover the second sensing means.

Figure 5:
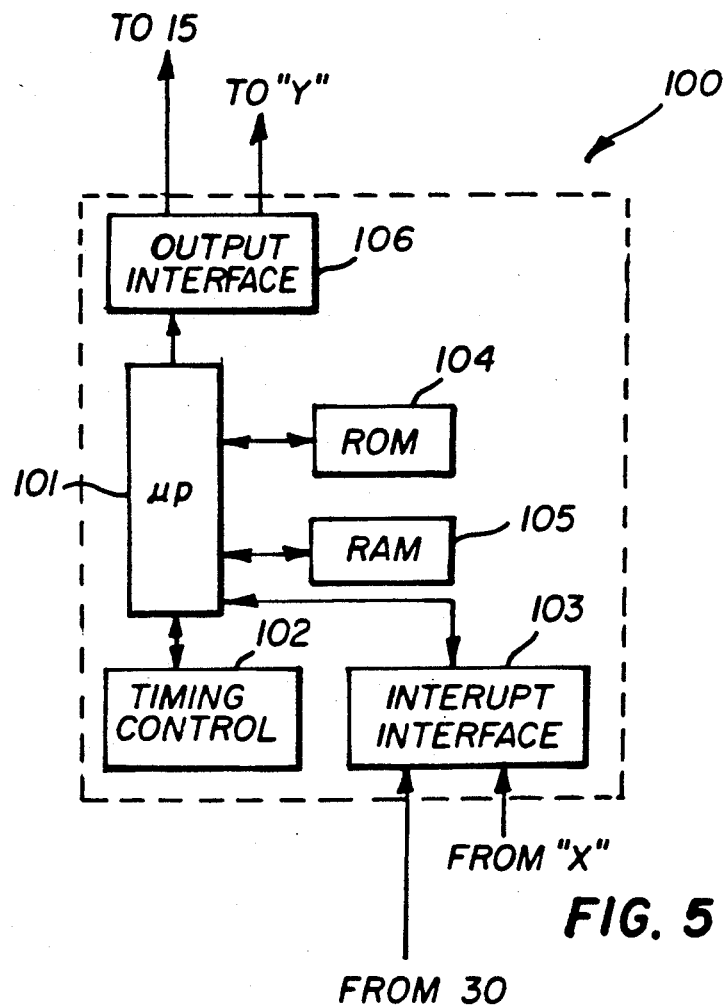
FIG. 5 is a schematic illustration of the apparatus control system in accord with the present invention.

Referring now to FIGS. 1 and 5, one preferred mode of operation in accord with the present invention can be described. As illustrated the output of detection circuit 30 is coupled to microcomputer machine control 100, which comprises microprocessor 101 with related timing control and interrupt interface sections 102, 103 and cooperative read only memory (ROM) 104 and read/write memory (RAM) 105. An output interface section 106 of machine control 100 is coupled to drive control 15, as well as other control units (denoted, e.g. "Y") of the overall machine in which the FIG. 1 transport system is utilized. The ROM 104 contains programs whereby the microcomputers is adapted to start-up and perform the various operations of the overall mchine, such as operations of the FIG. 1 subsystem, in coordination with other machine functions as described hereinafter.

Figure 6:
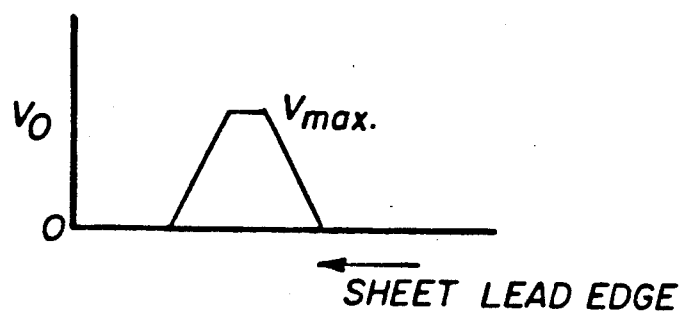
FIG. 6 is a graph showing detection charge versus sheet leading edge movement.

Thus, during each sheet feed as directed by machine control 100 in accordance with a program of ROM 104, another stored program in that ROM directs that output from detection circuit 30 be sampled at known intervals and stored in RAM 105. As the lead portion of a fed sheet moves progressively from right to left through the first sensing means 21, the signal Vo will increase progressively to a value Vmax (see FIG. 6), when the sheet lead end completely covers the area between the plates of first sensing means 21. The signals stored during sheet movement to cover the area between the plates of the first sensing means can be utilized in several modes, according to the present invention.

In a first mode, the signals are processed by microcomputer 101, in accordance with a program in ROM 104, to determine the value Vmax and subsequent signals are divided by the value Vmax to calibrate the signals sampled during movement of the lead edge of the sheet through the second sensing means. More specifically, in this mode the ROM 104 is programmed with nominal Vo values indicative of a known sheet positions during movement through the second sensor means. These values can be obtained by sampling the values Vo at different accurately measured (e.g. with a micrometer) positions of a test sheet lead edge (through the first sensing means) and dividing those values by the Vmax signal corresponding to the test sheet. During actual sheet feed operations, different sheets will yield different position voltage values due to differences in their dielectric characteristics (caused e.g. by different compositions, different "weights" or different moisture content). This first mode of the present invention dynamically calibrates for each different sheet by dividing the values Vo during movement through the second sensing means and comparing the dynamic quotient signal values to the stored nominal quotient signals. In th is mode, the machine control can detect accurately the position of the sheet lead edge at each stage of movement through the second sensing means. Moreover, by sampling at a plurality of predetermined intervals the velocity of the lead edge can be determined and drive control 15 adjusted accordingly to introduce the lead sheet edge at a predetermined position at a desired time, e.g. in register with an image transfer drum of a copier apparatus.

In another mode of operation, the sensors and detection circuit can be adjusted so that the value of the signal Vo ÷ Vmax during movement of the lead edge through the second sensor means is precisely inversely proportional to the distance which the lead edge has progressed. For example, when the lead edge is one-fourth into the second sensor means gap, the signal Vo is 0.75 Vmax and when three-fourths into the gap, Vo is 0.25 Vmax, etc. In this second mode, the value Vmax is stored for each sheet during movement through the first sensor, and microprocessor 101 computes calibrated percentage Vmax values for that particular sheet, e.g. ¾ Vmax, ½ Vmax, ¼ Vmax, for comparison to signals sampled during movement of the sheet lead edge through the second sensor means.

In another mode of operation the microprocessor can simply sample the signal Vo through the condition Vmax, and then periodically until the signal Vo returns to 0 volts. At the instant of return to the Vo =0 value, the drive control 15 can be stopped to leave the lead sheet edge precisely at the end of sensing means 22, or another operation can be intiated, e.g. the commencement of a printing or scan operation vis a vis the sheet.

In still another mode of operation the sensors means 21, 22 can be spaced further apart in the path length direction than the sheet length. In this mode the signal from the detection circuit 30 is sampled and stored as it increases from zero to Vmax. After the sheet trail end passes from between the first sensing means, the sheet lead end will move between the second sensing means and the signal, gradually increasing from zero to Vmax, is compared to the stored signal in analogous modes as described above.

The invention has been described in detail with particular reference to certain preferred embodiments thereof, but it will be understood that variations and modifications can be effected within the spirit and scope of the invention.

I claim:

1. In apparatus having a sheet feed path along which sheets are moved to a use location(s), an improved sheet movement detection system comprising:
   (a) first capacitor sensing means including a first pair of parallel plate members located in opposing relation on opposite sides of the feed path plane at an upstream position;
   (b) second capacitor sensing means including a second pair of parallel plate members which are correspondingly sized and spaced to said first plate members in opposing relation on opposite sides of the feed path plane at a downstream position;
   (c) detection circuit means for applying potentials across the pairs of plate members in a circuit configuration such that output signals of the first and second capacitor sensing means are detectable as sheet moves between said plate members; and
   (d) position signal means for receiving the output of said detection circuit means during movement of lead sheet edge through the second capacitor sensing means and providing a signal indicating the precise position of the sheet lead edge on said feed path.

2. The invention defined in claim 1 wherein said position signal means comprises computing means for storing the maximum value of said detection circuit signal during movement of a sheet end therebetween and comparing the signal detected during sheet edge movement through said second sensing means to said stored maximum signal value.

3. The invention defined in claim 1 wherein said position signal means comprises computing means for calibrating the signal output from said first circuit during movement of a lead sheet edge through said second sensing means based on the maximum signal from said detection circuit means during movement of said lead sheet edge through said first sensing means.

4. The invention defined in claim 3 wherein said computing means includes memory means having stored information, representative of nominal sheet lead edge positions versus calibrated detection circuit signals, and means for comparing detection circuit signals during sheet edge movement through said second sensing means, to said stored information.

5. The invention defined in claim 1 wherein said detecting means detects sheet position a plurality of times at known time intervals and provides a signal of sheet velocity.

6. The invention defined in claim 5 further including control means for adjusting a machine function in response to said sheet position or velocity signal.

7. In apparatus having a sheet feed path along which sheets are moved to a use location(s), an improved sheet movement detection system comprising:
   (a) first capacitor sensing means including a first pair of parallel plate members located in opposing relation on opposite sides of the feed path plane at an upstream position;
   (b) second capacitor sensing means including a second pair of parallel plate members which are correspondingly sized and spaced to said first plate members in opposing relation on opposite sides of the feed path plane at a downstream position, said second sensing means being located along said feed path so that a fed sheet can completely span the first and second pairs of plate members;
   (c) detection circuit means for applying potentials across the pairs of plate members in a circuit configuration such that output signals of the first and second capacitor sensing means are substracted from one another; and
   (d) position signal means for receiving the output of said detection circuit means during movement of a lead sheet edge through the second capacitor sensing means and providing a signal indicating the precise position of the sheet lead edge on said feed path.

* * * * *